(12) United States Patent
Kameshima

(10) Patent No.: US 7,705,911 B2
(45) Date of Patent: Apr. 27, 2010

(54) IMAGE PICK-UP APPARATUS AND IMAGE PICK-UP SYSTEM

(75) Inventor: Toshio Kameshima, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 430 days.

(21) Appl. No.: 11/549,468

(22) Filed: Oct. 13, 2006

(65) Prior Publication Data

US 2007/0069144 A1 Mar. 29, 2007

Related U.S. Application Data

(62) Division of application No. 11/266,297, filed on Nov. 4, 2005, now Pat. No. 7,138,639, which is a division of application No. 11/137,569, filed on May 26, 2005, now Pat. No. 7,002,157, which is a division of application No. 10/202,910, filed on Jul. 26, 2002, now Pat. No. 6,952,015.

(30) Foreign Application Priority Data

Jul. 30, 2001 (JP) ............................. 2001/230402

(51) Int. Cl.
H04N 5/225 (2006.01)
G05F 1/577 (2006.01)
(52) U.S. Cl. ...................... 348/372; 323/267
(58) Field of Classification Search ............... None
See application file for complete search history.

(56) References Cited

U.S. PATENT DOCUMENTS

| | | | |
|---|---|---|---|
| 3,602,802 A * | 8/1971 | Chan et al. ................... | 323/234 |
| 4,340,819 A | 7/1982 | Ogasawara et al. ......... | 250/208.1 |
| 4,811,086 A | 3/1989 | Hieda ........................ | 348/227.1 |
| 5,555,021 A | 9/1996 | Igarashi .................... | 348/222.1 |
| 6,191,411 B1 | 2/2001 | Kaifu ......................... | 250/214 |
| 6,633,335 B1 | 10/2003 | Kwon et al. ................ | 348/308 |
| 6,772,011 B2 | 8/2004 | Dolgin ....................... | 607/61 |
| 6,784,934 B1 | 8/2004 | Watanabe ................... | 348/308 |
| 6,952,015 B2 * | 10/2005 | Kameshima ........... | 250/370.11 |
| 7,002,157 B2 * | 2/2006 | Kameshima ........... | 250/370.11 |
| 7,138,639 B2 * | 11/2006 | Kameshima ........... | 250/370.11 |
| 2001/0033336 A1 | 10/2001 | Kameshima et al. ........ | 348/300 |

FOREIGN PATENT DOCUMENTS

| | | |
|---|---|---|
| EP | 0918434 | 5/1999 |
| JP | 04-111687 | 4/1992 |
| JP | 08-219874 | 8/1996 |
| JP | 08272461 A * | 10/1996 |
| JP | 09-051633 | 2/1997 |
| JP | 10-304134 | 11/1998 |

(Continued)

*Primary Examiner*—Justin P Misleh
(74) *Attorney, Agent, or Firm*—Fitzpatrick, Cella, Harper & Scinto

(57) ABSTRACT

An image pick-up apparatus comprising an area sensor in which detecting elements are two-dimensionally arranged on a substrate, and a reference supply circuit, for supplying a reference voltage to the detecting elements, which comprises a regulator for regulating the reference voltage. A low-pass filter is arranged between the regulator and the detecting elements. The reference voltage is supplied through the low-pass filter from the reference supply circuit.

25 Claims, 8 Drawing Sheets

FOREIGN PATENT DOCUMENTS

| | | |
|---|---|---|
| JP | 11-150255 | 6/1999 |
| JP | 11-219874 | 8/1999 |
| JP | 11-331883 | 11/1999 |
| JP | 2000-111649 | 4/2000 |
| JP | 2000-244818 | 9/2000 |
| JP | 2001-074552 | 3/2001 |

* cited by examiner

MTF CHARACTERISTICS OF HUMAN VISUAL SENSE

LINE NOISE LIMITATION CHARACTERISTICS
OBTAINED BY VISUAL SENSE CHARACTERISTICS

IMAGE PICK-UP APPARATUS AND IMAGE PICK-UP SYSTEM

CROSS-REFERENCE TO RELATED APPLICATION

This application is a divisional of application Ser. No. 11/266,297, filed Nov. 4, 2005, now U.S. Pat. No. 7,138,639, which is a divisional of 11/137,569, filed May 26, 2005, now U.S. Pat. No. 7,002,157, which is a divisional of application Ser. No. 10/202,910, filed Jul. 26, 2002, now U.S. Pat. No. 6,952,015. This application claims benefit of the filing date of application Ser. No. 10/202,910, and priority benefit of the filing date of Japanese Patent Application No. 230402/2001, filed Jul. 30, 2001. The entire contents of each of those prior applications is incorporate herein by reference.

BACKGROUND OF THE INVENTION

1. Field of the Invention

The present invention relates to image pick-up apparatus such as radiographic apparatus and the like and, more particularly, to image pick-up apparatus and an image pick-up system provided with a reference supply circuit for supplying a reference voltage for driving of an area sensor.

2. Related Background Art

A conventional example of image pick-up apparatus will be described below with the drawings. FIG. 7 is an equivalent circuit diagram of the conventional example and FIGS. 8A and 8B are diagrams showing its drive timing and output. As shown in FIG. 7, the conventional apparatus is provided with an area sensor in which pixels p1.1-3.3, each consisting of a photodiode as a detecting element and a TFT as a switching device for the photodiode, are arranged in a two-dimensional array and which is driven by matrix driving; a gate drive device 2 for driving the TFTs of the area sensor; a read device 1 to which signals outputted by the driven TFTs are transferred; and a reference supply circuit 4 for supplying reference voltages for driving or the like of the area sensor and other devices.

A gate electrode of the TFT in each pixel is coupled to a common gate line Vg1-Vg3, and the common gate lines are coupled to the gate drive device 2 comprised of an unrepresented shift register and the like. A source electrode of each TFT is coupled to a common data line sig1-sig3 to be coupled to the read device 1 comprised of amplifiers, sample hold circuits, an analog multiplexer, and so on.

In the present conventional example the reference supply circuit 4 supplies the following reference voltages.

Sensor bias voltage (Vs)
Sample hold reference voltage (VREF1)
Amp reset voltage (VREF2)
TFT on voltage (Von)
TFT off voltage (Voff)

Among these, the sensor bias voltage (Vs) is supplied directly from the reference supply circuit 4 to the area sensor. The sample hold reference voltage (VREF1) is supplied to the sample hold circuits of the read device 1, and the amp reset voltage (VREF2) to the amplifiers of the read device 1. The TFT on voltage (Von) and off voltage (Voff) are supplied through the gate drive device 2 to the area sensor.

The operation will be described below with the timing chart of FIG. 8A. A reading operation for one line will be described. In FIG. 8A, RES represents a reset signal to the amplifiers of the read device 1, Vg1-3 timing signals of a gate pulse to the respective common gate lines, SMPL a sampling timing signal to the sample hold circuits of the read device 1, and CLK an analog synchronization signal from the analog multiplexer of the read device 1.

The amplifiers are first reset, the TFTs are then turned on (Vg1), signal charges in the photodiodes of p1.1-p3.1 are transferred thereby to the amplifiers of the read device, the sample hold circuits (SMPL) sample and hold the charges, and the analog multiplexer provides an analog output thereof in synchronism with CLK. FIG. 8B is a diagram showing the output.

As described above, the conventional image pick-up apparatus is provided with the reference supply circuit to supply the reference voltages to the sensor, the gate drive device, the read device, and so on. FIG. 9 is a circuit diagram showing an example of the reference supply circuit in the conventional image pick-up apparatus. A device for regulating each reference voltage of the sensor bias voltage Vs, the TFT off voltage Voff, the TFT on voltage Von, and the amp reset voltage VREF2 is comprised of a 3-terminal regulator (e.g., TL317 available from Texas Instruments).

However, the supply circuit such as series regulator IC or the like has a random noise component due to flicker noise and thermal noise of semiconductors. For example, when the reference supply circuit is constructed of AD780 being the series regulator IC available from Analog Devices, the random noise component is approximately 100 nV/$\sqrt{\text{Hz}}$.

In the conventional image pick-up apparatus, this random noise component of the reference supply circuit sometimes caused line noise in an image. With variation in the amp reset voltage VREF2, the sample hold reference voltage VREF1, the TFT off voltage Voff, and the sensor bias voltage Vs in FIG. 7, there occurred the line noise as shown in the "actual analog signal" in FIG. 8B in certain cases. The line noise is given by the difference between the "ideal analog output" and the "actual analog signal" in FIG. 8B. Such line noise appeared in a stripe pattern in an image reproduced from the signal read by the area sensor, and degraded the quality of the image in some cases.

Particularly, high frequency components out of noise components of the reference voltages become beatlike line noise through sampling with the SMPL signal and are considered to have great effect on degradation of image quality. The occurrence of these line noise sometimes posed a problem in particular in the case where it was necessary to acquire the image data with a high degree of accuracy, e.g., in the case of X-ray image pick-up apparatus and the like.

The present invention has been accomplished in view of the above point and an object of the present invention is to provide image pick-up apparatus and an image pick-up system constructed to prevent the occurrence of the line noise due to the random noise component originating in the reference supply circuit for supplying the reference voltages

SUMMARY OF THE INVENTION

In order to solve the above problem, the present invention provides an image pick-up apparatus comprising an area sensor driven by matrix driving, and a reference supply circuit for supplying a reference voltage for driving of the area sensor, wherein the reference voltage is supplied through a low-pass filter (LPF) coupled to the reference supply circuit.

A cutoff frequency of the low-pass filter is determined so that an effective value of noise of the reference voltage having passed through the low-pass filter becomes not more than one tenth of an effective value of random noise produced in pixels of the area sensor.

DESCRIPTION OF THE PREFERRED EMBODIMENTS

Embodiments of the present invention will be described below in detail with reference to the accompanying drawings.

Embodiment 1

Figure 1:
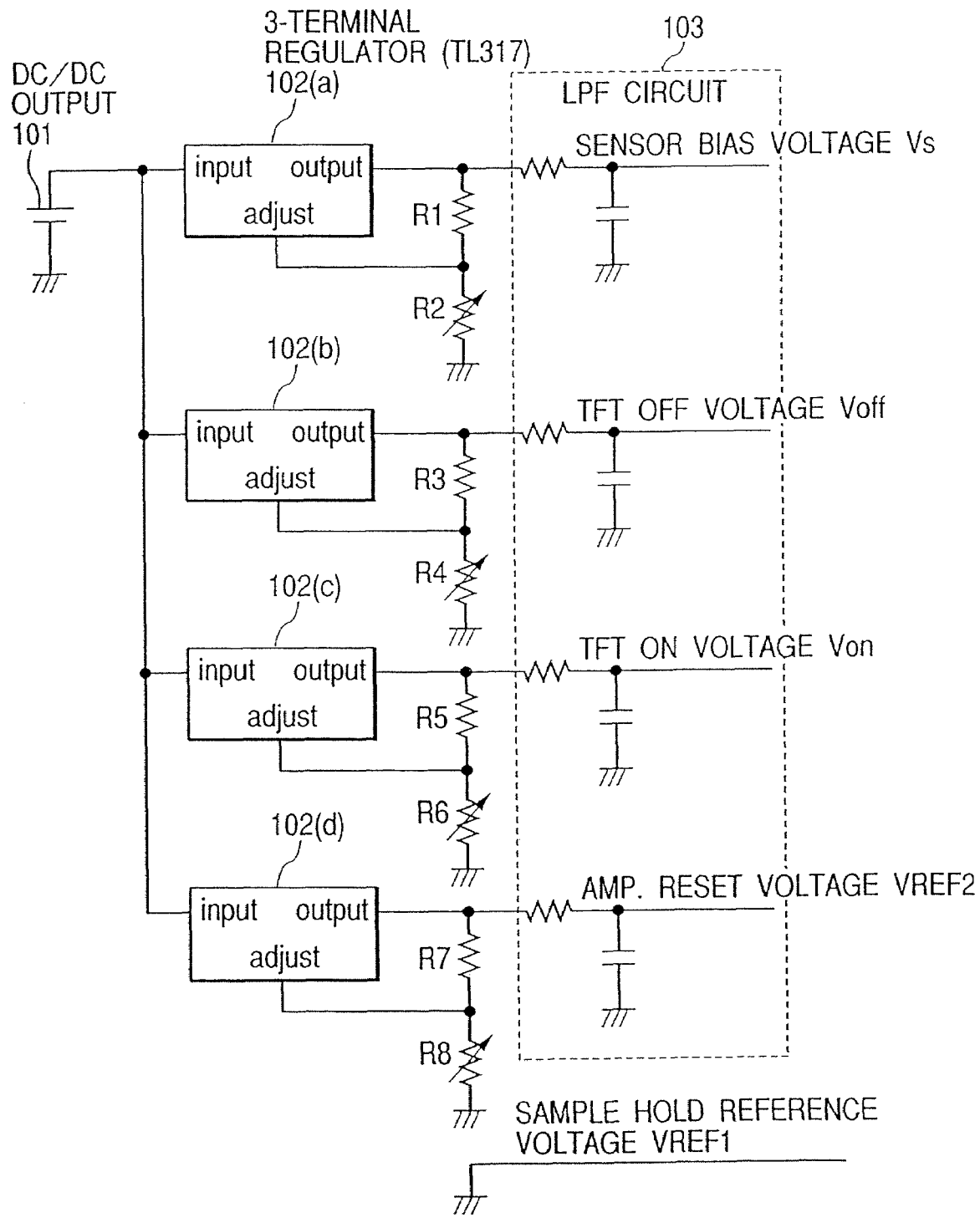
FIG. 1 is a circuit diagram of the reference supply circuit in Embodiment 1 of the present invention.

FIG. 1 is a schematic equivalent circuit diagram of the reference supply circuit in the present embodiment. The drive timing and others in the present embodiment can be similar to those in the conventional example.

Figure 9:
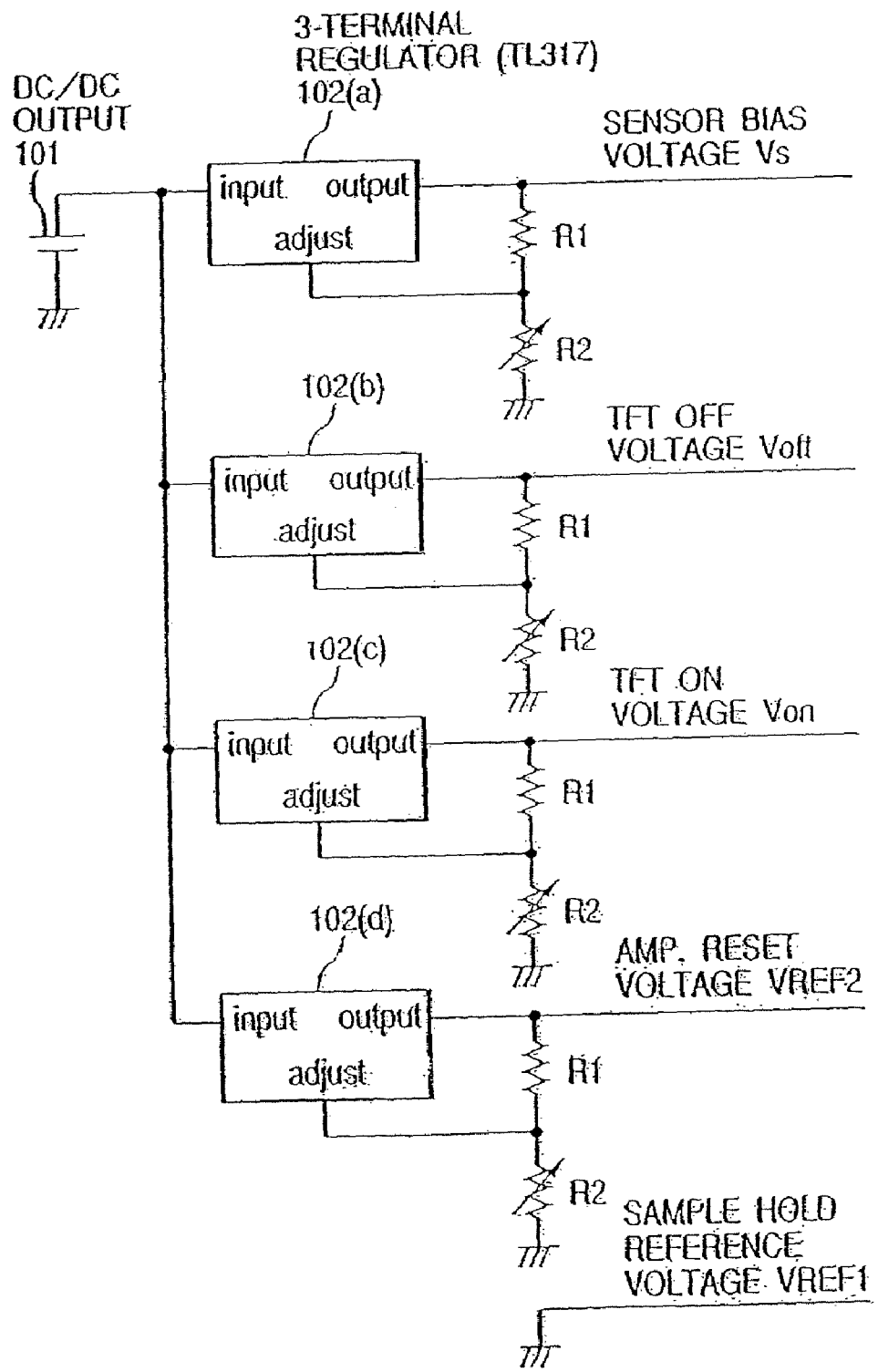
FIG. 9 is an equivalent circuit diagram of the reference supply circuit in the conventional example.

In the present embodiment, low-pass filter (LPF) circuits are added to outputs of regulator IC. The DC output 101 from the DC/DC converter (for example, DC/DC converter of the FIG. 9), the DC power, etc. is outputted by IC102($a$)-102($d$). The random noise of the regulator IC appears in the form of line noise in an image and can degrade the image quality. Particularly, high-frequency noise components provide great negative effect on the image quality. This is because the effective value of thermal noise of the regulators is determined by the product of noise density N (V/$\sqrt{Hz}$) and the bandwidth B ($\sqrt{Hz}$).

Namely, an effective means for reducing the effective value of noise of the regulators to decrease the line noise is to couple the low-pass filter (LPF) circuits to the outputs of the regulators as in the present embodiment. In this case, the cutoff frequency of LPF is desirably determined according to a required response time for each reference voltage.

The following presents examples of the "required response time for each reference voltage" stated herein.

A time between supply of power from a DC/DC converter or the like to the reference supply circuit and stabilization of the voltage level of each reference voltage at a certain level.

Or a time between supply of power from the DC/DC converter or the like and establishment of a state of being ready for acquisition of an image.

An interval of acquisition of image, i.e., a frame rate (particularly, in the case of the voltage such as the sensor bias voltage Vs or the like being changed by an unrepresented control circuit or the like), or the cutoff frequency of LPF ts desirably a frequency lower than a sampling frequency determined by the period of the SMPL signal. Specifically, the cutoff frequency of LPF is set to be 3 to 10 times the frame rate, which is effective to the line noise. In the case of photography of still images (e.g., approx. 2 frames/sec), it is preferable that fc (cutoff frequency)=6 to 20 Hz. When the number of frames is large as in the case of moving pictures or the like, for example, in the case of 30 frames/sec, it is preferable that fc 90 to 300 Hz.

It is verified from the result of experiment that it is hard for a man to visually perceive the line noise of the image pick-up apparatus when it is not more than one tenth of the random noise in pixels. Accordingly, the cutoff frequency of LPF is desirably determined so that the effective value of noise of each reference voltage becomes not more than one tenth of the effective value of the random noise in pixels.

In the present embodiment the LPFs are provided for the respective reference voltages of the sensor bias Vs, TFT off Voff, TFT on Von, and amp reset VREF2, but the LPFs may be provided for part of these reference voltages or for other reference voltages. The cutoff frequencies of the respective LPFs may be equal to or different from each other. The following will describe the effect achieved by the provision of the LPFs.

Figure 10:
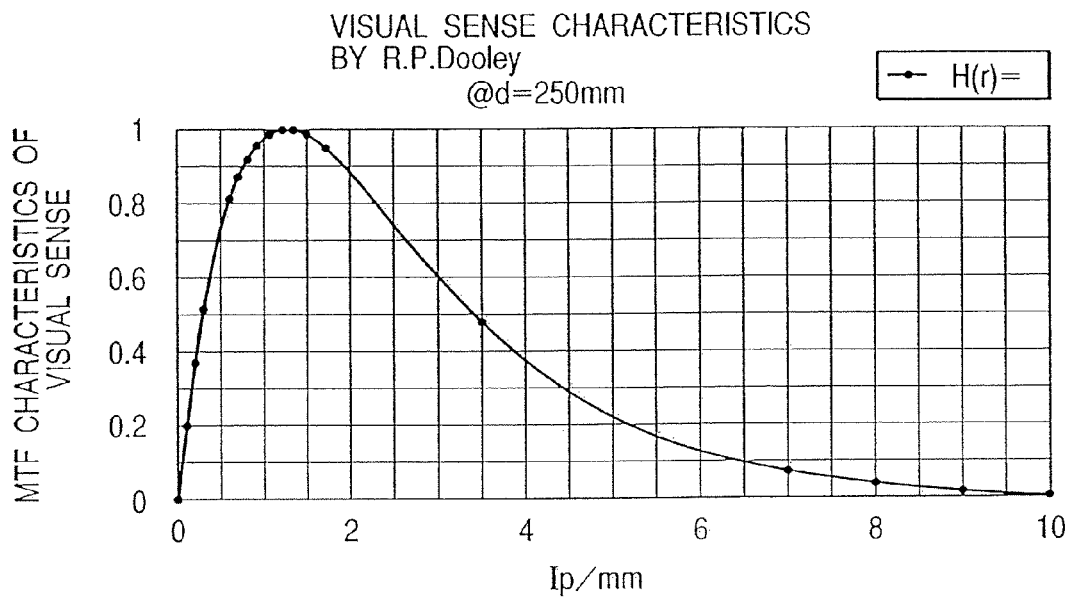
FIG. 10 is a graph to show the MTF characteristics of human visual sense.

It is well known that the human visual sense characteristics are band pass characteristics for spatial frequencies. Namely, as shown in FIG. 10, the human visual sense has such characteristics that a peak of visual sense exists at the spatial frequency of about one line pair/mm at the distance of distinct vision of 25 cm and the visual sense is lower in the lower frequency and higher frequency areas than the peak. At the spatial frequency of dc, i.e., 0 line pair/mm, the visual sense characteristics become approximately zero, so that almost nothing is seen.

Since the line noise in the image should not be seen by an observer, it is desirable that the line noise should possess characteristics matching the human visual sense characteristics. In consideration of the limitation of the line noise, the hardest point is the spatial frequency corresponding to the peak of the human visual sense characteristics.

Figure 11:
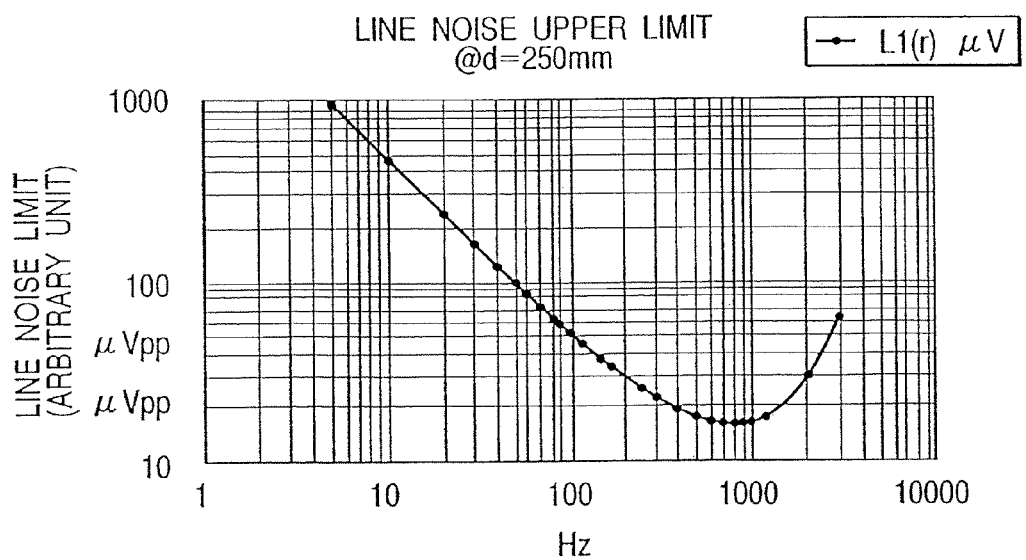
FIG. 11 is a graph to show the limitation characteristics of line noise obtained from the visual sense characteristics.

Since the visual sense characteristics are lowered at the lower spatial frequencies than the peak, the limitation can be relaxed there. Namely, since the human visual sense characteristics can be employed as a limitation to the perception of line noise, the limitation characteristics of line noise become reverse to the visual sense characteristics, as shown in FIG. 11, and are thus such low-pass characteristics that the limit is infinity at the spatial frequency of dc, i.e., 0 line pair/mm and is minimum at the peak frequency of visual sense.

Electrical temporal frequencies are sampled and held line by line in the sensor and thereafter reconstructed as an image; that is, they correspond in one-to-one correspondence to spatial frequencies of the image. Therefore, insertion of an electrical low-pass filter is equivalent to insertion of a spatial low-pass filter in the image, whereby the aforementioned effect can be achieved.

Embodiment 2

Figure 2:
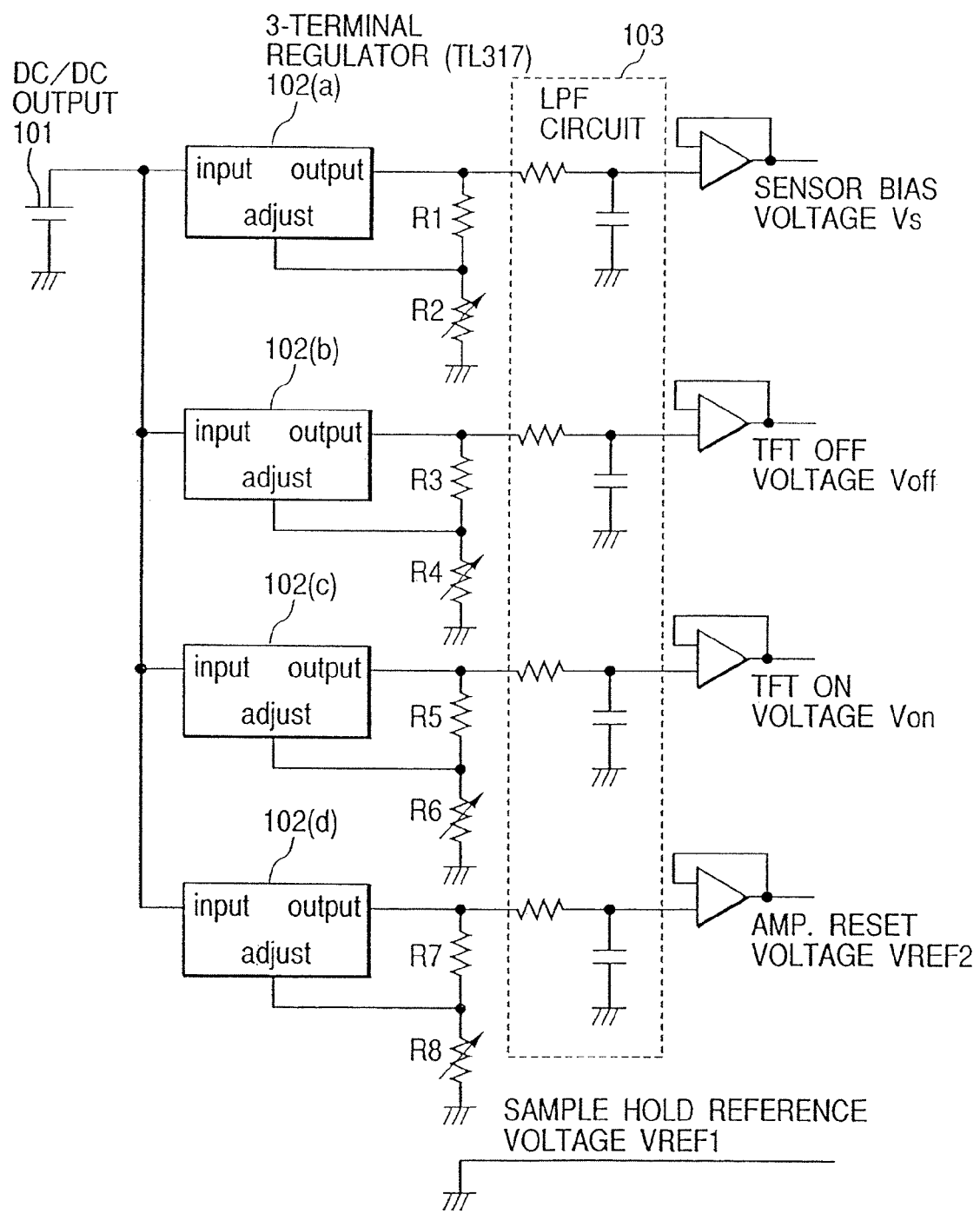
FIG. 2 is a circuit diagram of the reference supply circuit in Embodiment 2 of the present invention.

FIG. 2 is a schematic circuit diagram of the reference supply circuit in the present embodiment. The equivalent circuit diagram, the drive timing, etc. in the present embodiment are similar to those in the conventional example.

A point to be noted in the present embodiment is that amplifiers are further coupled to the outputs of the LPFs in Embodiment 1. This method is effective in the case where the reference voltages need to be supplied in low impedance.

It is, however, necessary to pay attention to selection of the amplifiers coupled to the outputs of the LPFs when the configuration of the present embodiment is employed. In order to reduce the line noise, it is desirable to select the amplifiers with the noise density of not more than 3.3 nV/$\sqrt{Hz}$. (It is particularly desirable to select them in the frequency region of 100 Hz to 100 kHz.) Describing this in further detail, the random noise of the area sensor used in the X-ray image pick-up apparatus is normally approximately several hundred μVrms. Since the line noise is preferably controlled to not more than one tenth of the random noise as described previously, the line noise needs to be not more than several ten μVrms. Accordingly, the sum of contribution of the LPF circuits to the line noise and contribution of the amplifiers to the line noise is preferably not more than several ten μVrms. For example, supposing that the contribution of the amplifiers to the line noise is set to not more than 1 μVrms and the frequency region of the amplifiers is 100 Hz to 100 kHz as described above, the noise density of the amplifiers is NnV/$\sqrt{Hz} \times \sqrt{100 kHz}$<1 μVrms, and by deforming this relation, we obtain N<3.3 nV/$\sqrt{Hz}$.

Embodiment 3

Figure 3:
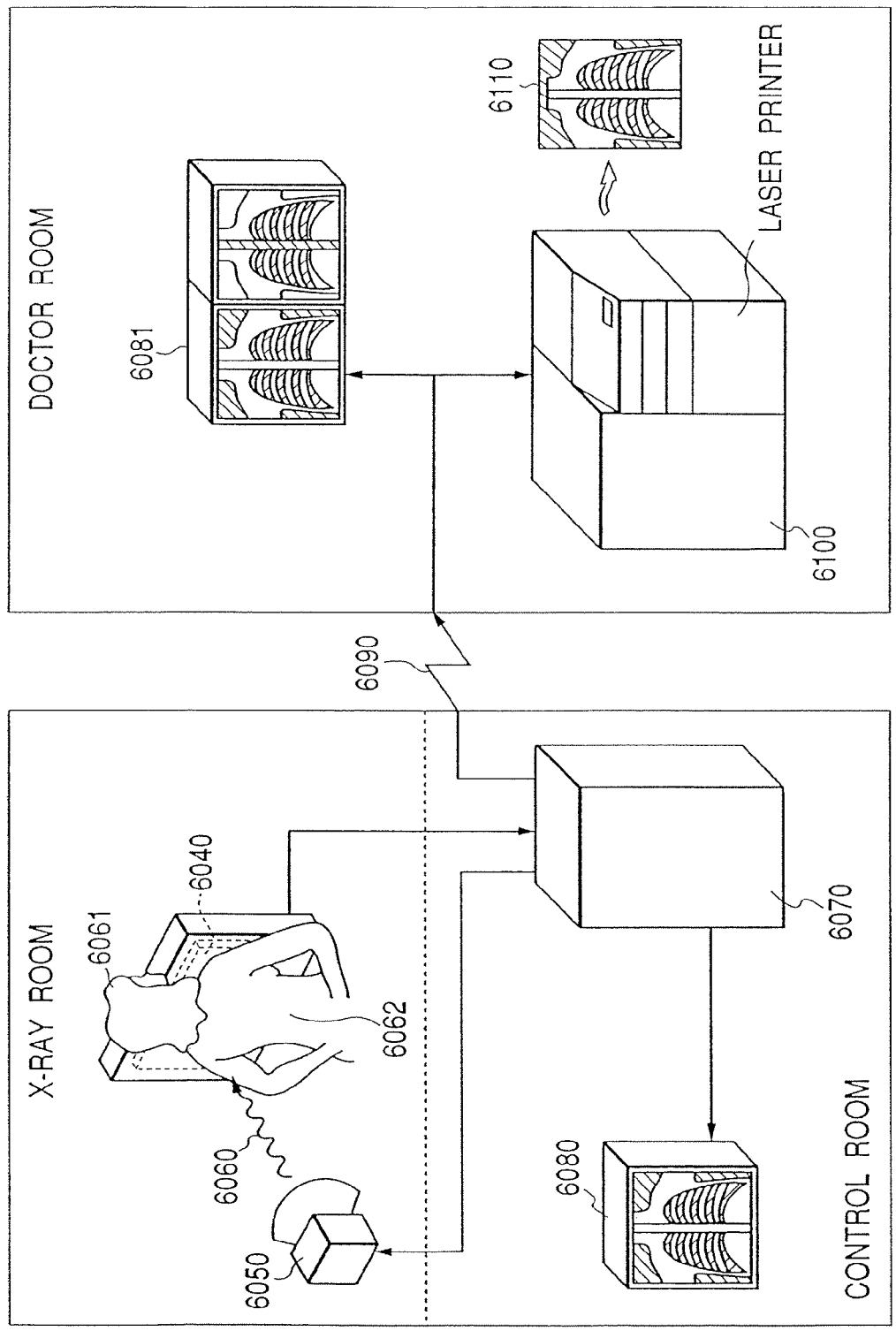
FIG. 3 is a schematic illustration to show a configuration of an application example of Embodiment 1 or 2 to an image pick-up system.

FIG. 3 shows an application example of the above embodiments to the image pick-up system. The present embodiment is an X-ray image pick-up system for taking an X-ray image, and the above embodiments are applied to X-ray image pick-up apparatus 6040. An X-ray tube 6050 as an X-ray generator generates X-rays 6060, the X-rays 6060 travel through an observing portion 6062 such as the chest part or the like of a patient or subject 6061, and they are then incident to the X-ray image pick-up apparatus 6040. The incident X-rays carry information about the interior of the subject 6061. The X-ray image pick-up apparatus 6040 acquires electrical information in correspondence to the incidence of X-rays. This information is converted into digital data, the digital data is subjected to image processing in an image processor 6070 as an image processing means, and the resultant image can be observed on a display 6080 as a display means placed in a control room.

This information can also be transferred through a transmission means such as a phone line, a radio link 6090, or the like to a remote place, whereby it is feasible to display the image on a display 6081 or output the image on a film or the like in a doctor room at a different place, thereby allowing a doctor at a remote place to make diagnosis. The information obtained can also be recorded or stored in recording media using various recording materials such as an optical disk, a magnetooptical disk, a magnetic disk, etc. or in a recording medium 6110 such as a film, paper, or the like by means of a recording means 6100 such as a film processor or the like.

The image pick-up apparatus in the image pick-up system used in nondestructive inspection, e.g., for medical diagnosis or for internal inspection, is required to read the image with a high degree of accuracy. Embodiments 1 and 2 are suitably applicable to such application, because the effect of the line noise is reduced.

Figure 4:
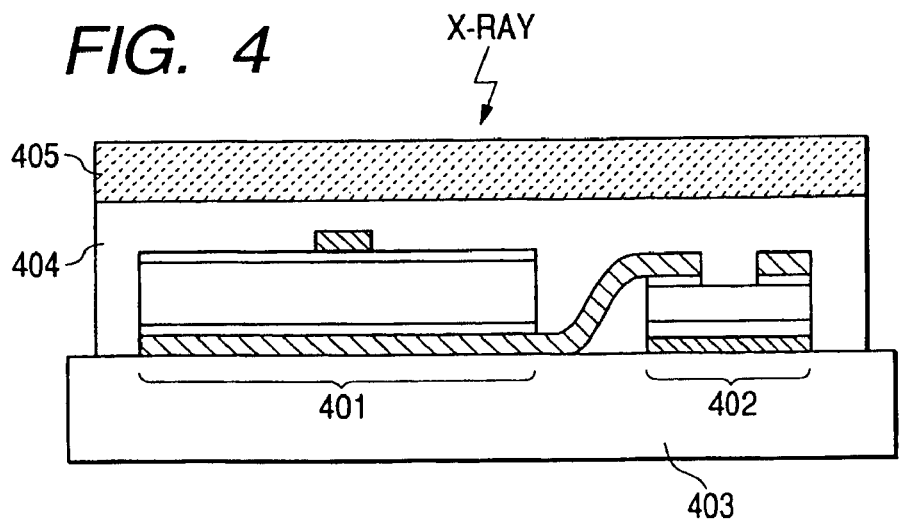
FIG. 4 is a sectional view in a one-pixel area of an X-ray image pick-up apparatus used in Embodiment 3.

FIG. 4 is a sectional view in one pixel of the X-ray image pick-up apparatus of the present embodiment. FIG. 4 shows an example in which the incident X-rays are converted into light and the light is detected, but it is also possible to use the image pick-up apparatus for directly detecting the X-rays as shown in FIG. 6.

Figure 5:
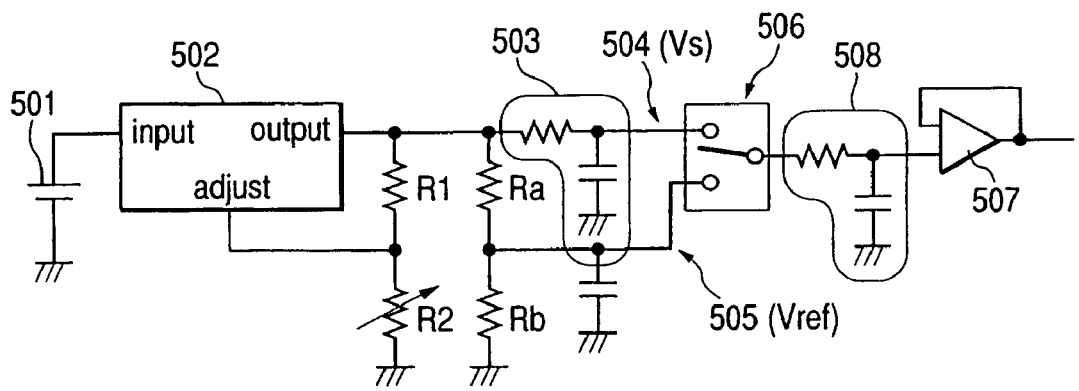
FIG. 5 is a circuit diagram to show a specific circuit example for biasing photosensors.

One pixel is comprised of a photosensor 401 such as a photodiode or the like, and a switching device 402 such as a TFT or the like, and such pixels are formed in a matrix pattern on a glass substrate 403. A phosphor layer 405 for converting incident X-rays into light is provided through a protective layer 404 on the pixel. The photodiode and TFT are preferably made of amorphous silicon or polysilicon, and the phosphor is preferably cesium iodide or a gadolinium base material. A preferable configuration is one using an MIS (Metal-Insulator-Semiconductor) device as the photosensor and a TFT as the switching device, because they can be produced in the same simple process. In the case of this configuration, it is preferable to prepare at least two types of biases applied to the photosensor, one as a bias for reading and the other as a bias for refreshing (to sweep out carriers accumulated in the device). Specifically, as shown in FIG. 5, a preferred circuit configuration consists of a DC/DC output supply 501, a regulator 502, a first LPF circuit 503, a read bias Vs terminal 504, a refresh bias Vref terminal 505, a multiplexer 506, an amplifier 507, and a second LPF circuit 50-8. As illustrated, the LPF circuits are provided for respective Vs and Vref, the voltages are switched by the multiplexer, and thereafter they are again amplified by the amplifier 507. The cutoff frequencies of the first LPF circuit and the second LPF circuit disposed before and after the multiplexer 506 are preferably approximately equal to each other. The reason for it is that if either one of the frequencies is set relatively lower the lower cutoff frequency will become dominant.

In the case where the biases applied to the photosensor are switched to be used as in the present embodiment, the time of switching from Vs to Vref in one frame, the response time from Vs to Vref, needs to be set so as not to affect the frame rate. For example, when the frame rate is set to the frame rate in the case of photography of still images (e.g., in the case of approximately 2 frames/sec), it is preferable to set fc=20 to 2000 Hz.

Figure 6:
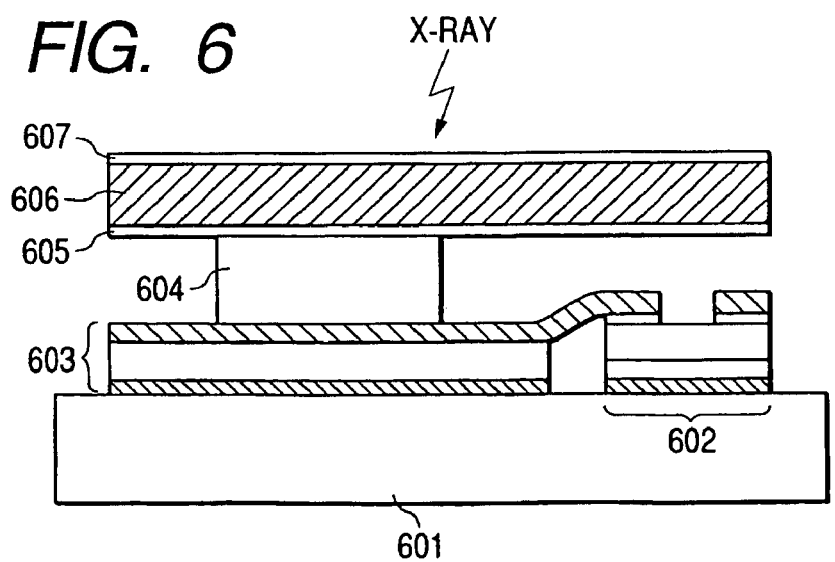
FIG. 6 is a sectional view in a one-pixel area of the X-ray image pick-up apparatus used in Embodiment 3.
Figure 7:
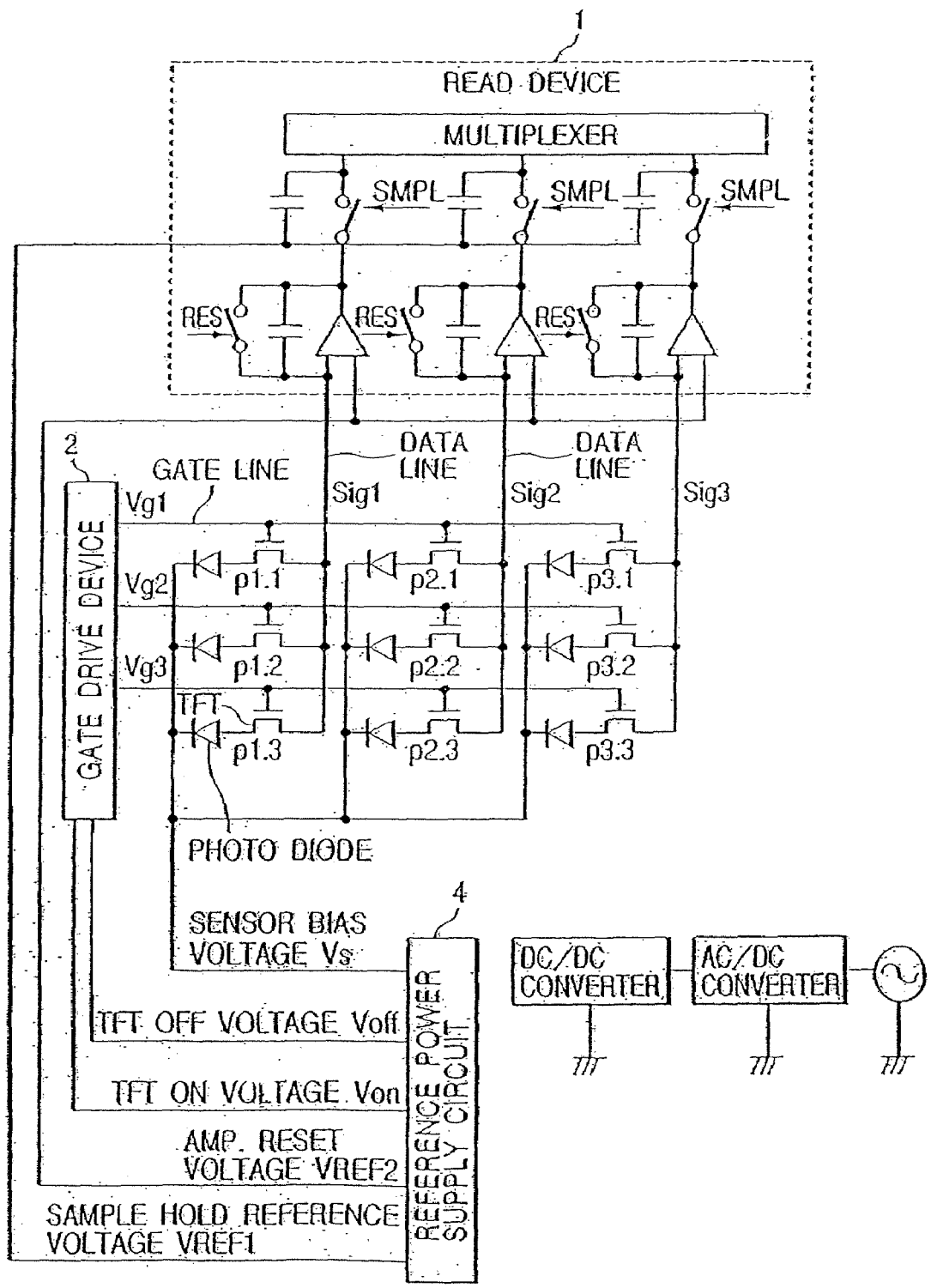
FIG. 7 is an equivalent circuit diagram of the ordinary image pick-up apparatus.
Figure 8A:
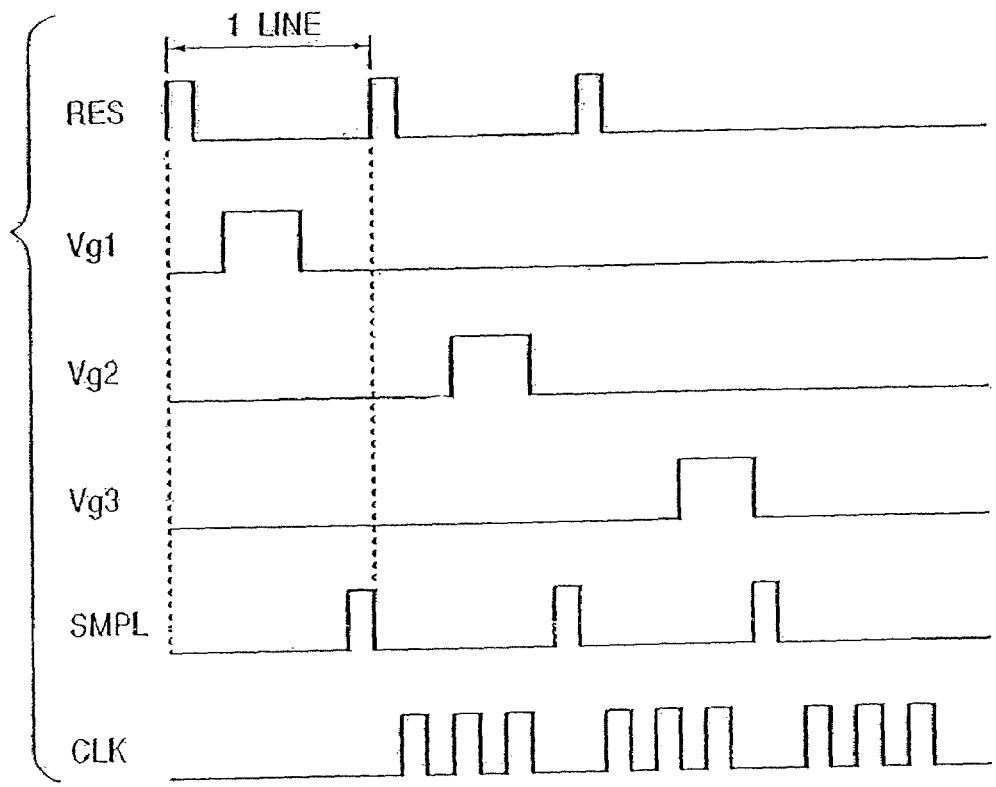
FIGS. 8A and 8B are a timing chart showing the driving of the ordinary image pick-up apparatus and a graph showing its output.
Figure 8B:
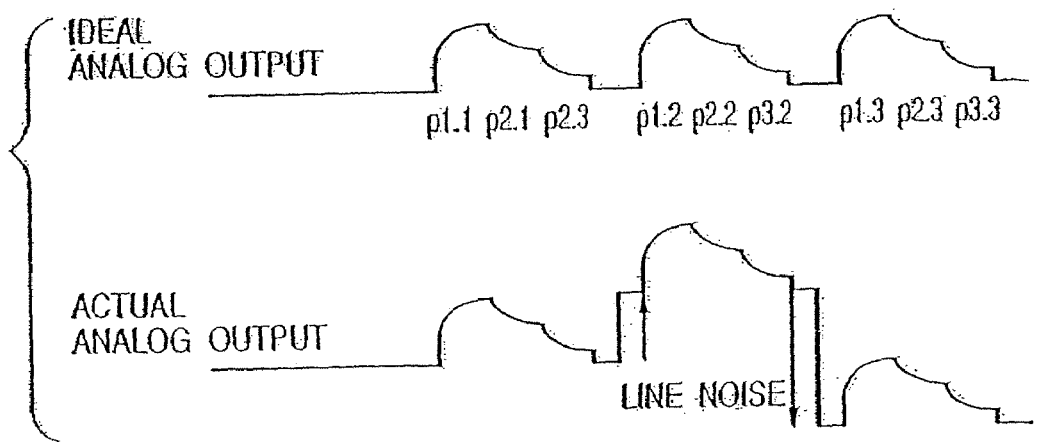

FIG. 6 is a sectional view in one pixel of the X-ray image pick-up apparatus in another embodiment. A pixel is constructed in a configuration wherein on a glass substrate 601 a drive substrate comprised of a switching device 602 such as a TFT or the like and a capacitor 603 for storing a signal charge is electrically coupled through a connection bump 604 to a radiation converting section (sensor device section) composed of a lower electrode 605, a conversion layer 606 for directly converting radiation such as X-rays or the like to an electric charge, and an upper electrode 607. In this configuration, the lower electrode 605 for each pixel is separated from others, and the separate electrode zones are arranged in a two-dimensional array. In this example the pixel is composed of the semiconductor material for directly converting X-rays into an electric charge, the storage capacitor and TFT coupled thereto, and so on. Just as in the case of the example of FIG. 4, the TFT is preferably made of amorphous silicon or polysilidon. Further, the X-ray-to-electron converting layer can be made of a material selected from gallium arsenide, gallium phosphide, lead iodide, mercury iodide, amorphous selenium, CdZn, CdZnTe, and so on.

When the apparatus is constructed in the configuration wherein the area sensor part is formed on the insulating substrate and the read circuit, the LPF circuits, etc. are made of ordinary crystalline silicon as in the present embodiment, it is feasible to decrease the time necessary for processing of detected signals. Since the sensor part (drive circuit substrate) is the insulating substrate, the above configuration is preferable, because the noise can be reduced, particularly, in application as radiation image pick-up apparatus.

What is claimed is:

1. An image pick-up apparatus comprising:
    an area sensor in which detecting elements are two-dimensionally arranged on a substrate;
    a read device for reading a signal from the detecting elements;
    a power supply circuit, for supplying a reference voltage to the read device, which comprises a regulator for regulating the reference voltage; and
    a low-pass filter arranged between the regulator and the read device, wherein the reference voltage is supplied through the low-pass filter from the power supply circuit,
    wherein the read device comprises a sample-hold circuit, and
    wherein a cutoff frequency of the low-pass filter is lower than a sampling frequency of the sample-hold circuit.

2. The image pick-up apparatus according to claim 1, wherein the read device comprises an amplifier for amplifying the signal, the power supply circuit supplies an amp reset voltage as the reference voltage to the amplifier, and the low-pass filter is arranged between the regulator and the amplifier.

3. The image pick-up apparatus according to claim 1, wherein a cutoff frequency of the low-pass filter is determined according to required response time for the reference voltage.

4. The image pick-up apparatus according to claim 1, wherein an amplifier is placed on the output side of the low-pass filter.

5. The image pick-up apparatus according to claim 4, wherein a noise density of the amplifier less than 3.3 nV/√Hz.

6. The image pick-up apparatus according to claim 1, wherein the area sensor comprises a two-dimensional array of pixels, each having the detecting device and a switching device, wherein the detecting device is a photoelectric conversion device and the switching device is a TFT, and wherein the photoelectric conversion element is coupled to a drain electrode of the TFT, a gate electrode of the TFT to a common gate line, a source electrode of the TFT to a common data line, the common data line to read device, and the common gate line to a gate drive device, thereby implementing matrix operation.

7. The image pick-up apparatus according to claim 6, wherein the read device has the amplifier coupled to the common data line and being capable of reset operation and an amplifier reset voltage as the reference voltage of the amplifier is supplied thereto from the power supply circuit.

8. The image pick-up apparatus according to claim 6, wherein the photoelectric conversion element and TFT are made of amorphous silicon or polysilicon.

9. The image pick-up apparatus according to claim 6, wherein the area sensor is an X-ray area sensor further comprising a phosphor.

10. The image pick-up apparatus according to claim 1, wherein the substrate is an insulating substrate and the power supply circuit and the low-pass filter are formed on a crystalline substrate.

11. An image pick-up system comprising the image pick-up apparatus as set forth in claim 1, image processing means for processing a signal from the image pick-up apparatus into an image, recording means for recording a signal from the image processing means, display means for displaying a signal from the image processing means, and transmitting means for transmitting a signal from the image processing means.

12. The image pick-up system according to claim 11, further comprising a wavelength conversion element for converting radiation into wavelengths in a sensitive region of the sensor elements.

13. An image pick-up apparatus comprising:
    an area sensor in which detecting elements are two-dimensionally arranged on a substrate;
    a read device for reading a signal from the detecting elements;
    a power supply circuit, for supplying a sensor bias voltage to the detecting elements of the area sensor and for supplying a reference voltage to the read device, which comprises a first regulator for regulating the sensor bias voltage and a second regulator for regulating the reference voltage;
    a first low-pass filter arranged between the first regulator and the detecting elements, wherein the sensor bias voltage is supplied through the first low-pass filter from the power supply circuit; and
    a second low-pass filter arranged between the second regulator and the read device, wherein the reference voltage is supplied through the second low-pass filter from the power supply circuit,
    wherein the read device comprises a sample-hold circuit, and
    wherein a cutoff frequency of the second low-pass filter is lower than a sampling frequency of the sample-hold circuit.

14. The image pick-up apparatus according to claim 13, wherein the read device comprises an amplifier for amplifying the signal, the power supply circuit supplies an amp reset voltage as the reference voltage to the amplifier, and the second low-pass filter is arranged between the second regulator and the amplifier.

15. The image pick-up apparatus according to claim 13, wherein a cutoff frequency of the first low-pass filter and a cutoff frequency of the second low-pass filter are respectively determined according to required response time for the reference voltage.

16. The image pick-up apparatus according to claim 13, wherein a cutoff frequency of the first low-pass filter is lower than a sampling frequency of the sample-hold circuit.

17. The image pick-up apparatus according to claim 13, wherein the area sensor comprises a two-dimensional array of pixels, each consisting of the detecting device and a switching device, wherein the detecting device is a photoelectric conversion device and the switching device is a TFT, and wherein the photoelectric conversion element is coupled to a drain electrode of the TFT, a gate electrode of the TFT to a common gate line, a source electrode of the TFT to a common data line, the common data line to read device, and the common gate line to a gate drive device, thereby implementing matrix operation.

18. The image pick-up apparatus according to claim 17, wherein the power supply circuit further comprises a third regulator for supplying a TFT off voltage to the gate electrode of the TFT through the drive device, and the third low-pass filter is arranged between the third regulator and to the gate electrode of the TFT.

19. The image pick-up apparatus according to claim 18, wherein the power supply circuit further comprises a fourth regulator for supplying a TFT on voltage to the gate electrode of the TFT through the drive device, and the third low-pass filter is arranged between the third regulator and to the gate electrode of the TFT.

20. The image pick-up apparatus according to claim 17, wherein the read device has the amplifier coupled to the common data line and being capable of reset operation and an amplifier reset voltage as the reference voltage of the amplifier is supplied thereto from the power supply circuit.

21. The image pick-up apparatus according to claim 17, wherein the photoelectric conversion element and TFT are made of amorphous silicon or polysilicon.

22. The image pick-up apparatus according to claim 17, wherein the area sensor is an X-ray area sensor further comprising a phosphor.

23. The image pick-up apparatus according to claim 13, wherein the substrate is an insulating substrate and the power supply circuit and the low-pass filter are formed on a crystalline substrate.

24. An image pick-up system comprising the image pick-up apparatus as set forth in claim 13, image processing means for processing a signal from the image pick-up apparatus into an image, recording means for recording a signal from the image processing means, display means for displaying a signal from the image processing means, and transmitting means for transmitting a signal from the image processing means.

25. The image pick-up system according to claim 24, further comprising a wavelength conversion element for converting radiation into wavelengths in a sensitive region of the sensor elements.

* * * * *